United States Patent [19]

Kaplan

[11] 4,327,369
[45] Apr. 27, 1982

[54] ENCAPSULATING MOISTURE-PROOF COATING

[75] Inventor: Neil Kaplan, Great Neck, N.Y.

[73] Assignee: Hi-Tech Industries, Inc., New York, N.Y.

[21] Appl. No.: 180,904

[22] Filed: Aug. 25, 1980

Related U.S. Application Data

[63] Continuation-in-part of Ser. No. 64,005, Aug. 6, 1979, abandoned.

[51] Int. Cl.³ .............................................. H01L 23/30
[52] U.S. Cl. ................................. 357/72; 264/272.11; 174/52 PE; 427/82
[58] Field of Search ............... 357/72; 427/82; 525/29; 174/52 PE; 264/272

[56] References Cited

U.S. PATENT DOCUMENTS

| | | | |
|---|---|---|---|
| 3,788,895 | 1/1974 | Schimmer | 427/93 |
| 3,849,187 | 11/1974 | Fetscher | 357/72 |
| 3,931,026 | 1/1976 | Berkner | 252/63.2 |
| 3,946,427 | 3/1976 | Iwasawa | 174/52 PE |
| 3,975,757 | 8/1976 | Sporck | 357/72 |
| 4,017,340 | 4/1977 | Yerman | 427/82 |
| 4,129,543 | 12/1978 | Kaplan | 525/29 |
| 4,136,080 | 1/1979 | Berger | 525/29 |
| 4,173,683 | 11/1979 | Comizzoli | 427/82 |

FOREIGN PATENT DOCUMENTS 52-21868 6/1977 Japan .................................. 427/82

*Primary Examiner*—John D. Smith
*Attorney, Agent, or Firm*—Howard C. Miskin

[57] ABSTRACT

A resin formulation, especially adapted for use in the encapsulating of electronic or electric devices, is provided. The formulation comprises a thermosettable resin composition to which has been added an effective amount of a trialkoxyorgano-metal silane compound. The formulation also preferably includes a solid filler material.

11 Claims, No Drawings

ENCAPSULATING MOISTURE-PROOF COATING

This invention relates to a material for use in forming moisture-proof encapsulations of moisture-sensitive elements, such as electric and electronic devices and components, especially semi-conductor devices, such as transistors, diodes, capacitors, and integrated circuits.

The art has long been aware of the problem created by the effect of moisture both on, e.g., semi-conductor devices, which are primarily formed of a semi-metallic element, or elements, such as silicon and/or germanium, or on the metallic conductor leads embedded within the semi-conductor material, such as copper wire. The encapsulation of such electric or electronic devices with synthetic polymer resins, such as polyester materials, epoxy resins or other liquid thermoset materials, was intended, in part, to eliminate the problem of moisture on these materials, as well as to increase the mechanical structural strength of such inherently fragile devices.

Polymeric resin encapsulating techniques for such devices were relatively successful in overcoming structural fragility by increasing structural strength and durability. It had long been known, however, that moisture was not sealed out by encapsulation because the encapsulating materials are inherently permeable to moisture, and also that there was an incomplete seal at the outer interface between the, e.g., leads and the encapsulating resin.

One attempt to solve the problem created by moisture seepage along the interface, was the use of a polyester material having a high degree of shrinkage. It was believed that the shrinkage would create a tighter bond between the encapsulating resin and the leads, thus preventing the transmission of moisture past the interface. This was not wholly successful as a moisture-preventive, and in addition, unfortunately created a perhaps even more significant problem of structural fragility. The stress placed upon the encapsulated device by the shrinking resin capsule, often resulted in excessive strain upon the device resulting in an unacceptable rate of breakage.

In accordance with the present invention, means have been provided for forming a far more moisture-resistant coating upon a substrate and most especially a coating that forms a substantially moisture-proof interface with a metallic surface extending through and outside of the coating, such as the electrically conductive lead from an electronic device. The coating preferably is applied to a substrate in conjunction with the encapsulation of an electronic or electrical device in a synthetic resin polymer capsule. The present invention comprises applying a trialkoxy organometalsilane compound to, for example, a semi-conductor substrate, in the presence of moisture and at elevated temperatures, and preferably in contact with a second, metallic mold surface, so as to form the moisture-resistant coating by interaction between the metallic surface and the substrate surface, moisture and silane; the moisture-resistant coating thus formed bonds closely to the semi-conductor substrate, and has excellent dielectric properties. It is believed that where a metal mold surface is utilized to shape the outer portion of the capsule, a double moisture-proof seal is formed.

The trialkoxy organometal silane should be added in an amount sufficient to significantly increase moisture resistance of the molded resin. An amount in the range of from about 0.5 to 5 percent by weight of the resin has been found adequate. Higher quantities can be added if desired.

In accordance with the most preferred aspect of the present invention, a trialkoxy organometalsilane compound is admixed into an encapsulating resin molding composition. The resin composition is molded around the substrate, such as an electronic diode component having a semi-conductor metallic surface, in accordance with conventional procedures in a metal mold. In accordance with such procedures, the substrate is encapsulated in the molding composition, within a mold, at a temperature of at least about 125° C. The mold preferably has a metallic surface so as to form a moisture-resistant shield on the outer surface of the resin capsule, as well. Thus, a double moisture-resistant shield is formed in a single step, by this most preferred embodiment.

For a reason that is not completely understood, the presence of the metal surface results in the formation of a moisture-resistant film on the resin capsule.

It is also possible, however, to carry out the process of the present invention in several steps, in series, by initially applying the trialkoxy organometalsilane material to a semi-conductor device, for example, by dipping or spraying the device so as to form a thin film of the trialkoxy silane on the device. The coated substrate is subjected to heat, so as to increase the reaction rate of the trialkoxy silane to form the moisture-resistant shield, or film. The film-coated device can then be encapsulated with a conventional resin material in accordance with standard procedures. The resin will form a secure and moisture-resistant bond to the moisture-resistant film, so as to result in the desired moisture-resistant coating. If the outer moisture-resistant shield is also desired, the encapsulated device can be again coated with the trialkoxy silane, replaced in a mold and subjected to heat. The metal mold surfaces act in the reaction forming the outer moisture-resistant coating on the outer surface of the resin capsule.

The trialkoxy organometalsilane compound used in the present invention can be defined by the empirical formula:

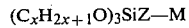

$$(C_xH_{2x+1}O)_3SiZ\text{---}M$$

wherein x is an integer from 1 to about 6 and Z can be an organic group containing up to about 28 carbon atoms and reactive with the encapsulating resins, and M is a metal, especially an alkali metal, such as sodium, potassium, lithium or cesium, or aluminum, preferably bonded directly to a carbon atom on the Z-group. The alkoxy group preferably contains no more than about 3 carbon atoms, most preferably no more than 2 carbon atoms, and optimally is a methoxy group. The Z group preferably contains not more than about 20 carbon atoms, and optimally from about 6 to about 18 carbon atoms.

Thus, preferred alkoxy groups, other than the optimal methoxy group, include ethoxy, n-propoxy, and 2-isopropoxy. Mixtures of alkoxy groups can be present, as in ethoxy-di-methoxysilane, methoxy-diethoxysilane and propxy-diethoxysilane.

Preferably, the organic Z groups can be any group which is connected to the silcon atom and to the metal atom, M, each through an aliphatic carbon atom, and which includes a moiety reactive with the encapsulating resin. Such active moieties include vinyl, amino, vinylcarboxy, mercapto and epoxy groups. Silane compounds having lesser effectiveness can be used, wherein the metal atom can be connected to the Z-group through, e.g., an oxygen or nitrogen atom or the Z-group can be connected to the silicon atom through, e.g., an oxygen atom. Thus, the Z group can be a purely aliphatic or cycloaliphatic group, such as an alkylamino group, a mercaptoalkyl group, or such cycloakyl groups, an olefinically unsaturated aliphatic or cycloaliphatic group, such as a gamma-methacrylic ester group, or an acetylenically unsaturated aliphatic or cycloaliphatic group, or can include, aromatic groups including carbon rings and heterocycle aromatic groups, either as part of a chain or as side groups. The inert portion of the Z group can be hydrocarbyl or can include nonhydrocarbyl substituents forming part of an aliphatic chain, such as ether oxygen or thioether sulfur, carbonyl oxygen or thiocarbonyl sulfur, sulfonyl, or halogen atoms. It has been found that free carboxyl groups or free hydroxyl groups are contraindicated as tending to interfere with the film formation. The organic Z groups are most preferably terminated with the metal atoms, which can be covalently bonded or ionically bonded directly to a carbon atom. The metal atom is separated from the silicon atom preferably by at least about one carbon atom, most preferably at least about two, and optimally at least about seven atoms.

Where the Z group is polyvalent, i.e., divalent or higher, two or more tri(alkoxyl) silane groups can be attached to a single Z group.

Thus, Z groups include, for example, aliphatic amino groups, e.g., alkylamino groups such as,

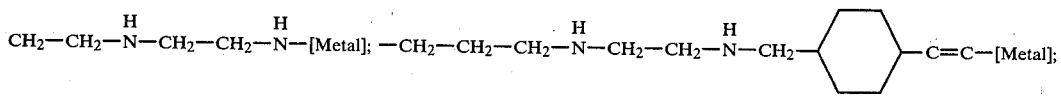

and vinyl carboxyester groups, e.g., methacryloxy ester groups, such as,

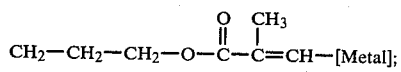

epoxy groups, such as,

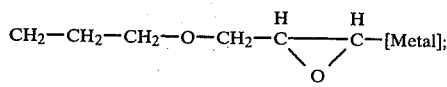

vinyl groups, such as sodium vinylbenzene; and a metal salt group, such as,

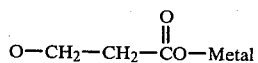

Example of Trialkoxy organometalsilane compounds useful in accordance with this invention include: Sodium-vinyl benzentri(methoxy)silane;

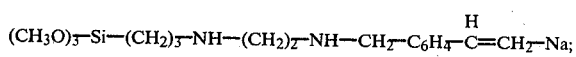

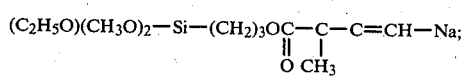

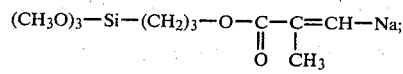

Potassium vinyl benzenetri(ethoxy)silane;

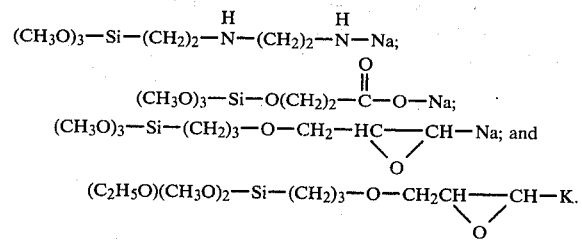

The trialkoxysilane organometal compounds are used in combination with a variety of suitable encapsulating resins in accordance with this invention. Preferably the silane compound is mixed into a thermosettable resin composition that is liquid at room temperature. Alternatively, the compounding can occur at elevated temperatures above the melting point of the resin which is solid at room temperature.

When such an elevated mixing temperature is utilized, it is especially important to avoid using any metal surfaced implements, whether as container or as the mixer. Even at room temperatures, however, non-metallic implements are preferred, such as glass, ceramic, or other synthetic polymers. Glass-coated or porcelainized metals can, of course, be utilized, as long as there is no contact with a metal surface.

In the most common commercial practice, liquid, thermosettable polyester resins or liquid, thermosettable, epoxy resins are used for the encapsulation of such fragile, metal-surfaced elements as electrical or electronic semi-conductor devices, such as transistors, diodes, capacitors and integrated circuit chips.

The present invention preferably can be carried out in conjunction with substantially the full range of the available thermosetting, unsaturated polyesters. The methods of preparing such thermosettable, unsaturated polyester resin compositions are well-known and are not a part of this invention. Such polyesters can be prepared, for example, by condensing an α, B, -ethylenically unsaturated dicarboxylic acid or anhydride, or mixtures thereof, with a dihydric alcohol, or mixtures of dihydric alcohols.

The most commonly available commercial polyesters are prepared from maleic acid or fumaric acid, with dihydric alcohols such as ethylene glycol, propylene glycol, butylene glycol, diethylene glycol, dipropylene glycol, triethylene glycol, or others. The degree of unsaturation available for cross-linking in the thermosettable polyesters is usually varied by replacing a portion, usually not more than about 25%, of the unsaturated dibasic acid with a saturated dibasic acid, such as orthophthalic acid, isophthalic acid, terephthalic acid, succinic acid, and others.

The most generally available such thermosettable, linear, polyesters include the polycondensation products of (1) propylene glycol and maleic or fumaric acid; (2) 1,3-butanediol and maleic or fumaric acid; (3) mixed ethylene glycol-propylene glycol, with maleic or fumaric acid; (4) mixed propylene glycol and dipropylene glycol with maleic or fumaric acid; and (5) diethylene glycol with maleic or furmaric acid; these polyesters are usually modified to reduce unsaturation with minor proportions of one of the phthalic acids.

The encapsulating compositions are conventionally prepared by admixing the above-described unsaturated polyesters, with a copolymerizable monomer, or cross-linking agent, generally of the vinyl type, i.e., including the group

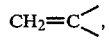

in each molecule. The cross-linking agent is commonly soluble, or miscible, with the polyesters resin, and most commonly is styrene. Other commercially used cross-linking agents include vinyltoluene, diallylphthalate, alpha-methyl styrene and methylmethacrylte, or mixtures thereof.

A commercially suitable encapsulating mixture, or "compound", as it is known, generally includes in addition to the linear polyester and cross-linking agent, such as described above, a suitable catalyst, or initiator, a solid inert filler material, and parting or mold release agents. All of these are well-known to the art and need not be more fully described herein. Suitable compounds are described in greater detail in many publications together with procedures for use.

Liquid, thermosettable polyepoxide resins are also conventionally used for encapsulation of substrate such as electric or electronic devices. Useful such polyepoxides can be saturated or unsaturated, aliphatic, cycloaliphatic, aromatic or heterocyclic. Commonly used polyepoxides include epoxidized triglycerides, such as epoxidized glyceryl trioleate; epoxidized polyethers of polyhydric phenols, obtained by condensing a polyhydric phenol with an epihalohydrin in alkaline medium.

Suitable epoxy encapsulating mixtures, or molding compounds, also contain a curing agent, such as an amine, acid anhydride, organic acid phosphates, sulfonic acid or sulfonyl halide. Such epoxy encapsulating compounds are described in greater detail, in many publications, together with procedures for use.

When using thermosettable polyesters, care must be taken to avoid too high shrinkage during setting. Generally shrinkage should not be greater than about 0.012 inch per inch of material to avoid problems of cracking of the desired moisture-proof shield of this invention. Most preferably shrinkage is less than about 0.01 inch per inch, and optimally less than about 0.008 inch per inch.

Shrinkage is conventionally avoided in the art by the addition of a minor quantity of a compatible thermoplastic resin to the thermosettable polyester resin compound, for example a vinyl type material, especially polystyrene. This is a well-known expedient to the art. The thermoplastic resin is added in a proportion generally of not greater than about 40% by weight of the thermosettable resin, in order to reduce the shrinkage to a desired level.

Other compatible means for reducing shrinkage during setting of the encapsulating resin can also be used with this invention. It is only necessary that the material added not interfere with the activity of the trialkoxysilane. For example, the addition of a solid filler is known to reduce shrinkage during setting.

A filler can be present in the encapsulating resin to reduce shrinkage, as well as for any other desirable reason, such as to color the capsule or to obtain desirable properties. To have the desired effect of reducing shrinkage, it is preferred that the proportion of filler used be not less than about 100% by weight of the resin, and most preferably not greater than about 350% by weight of the resin.

Suitable filler materials for each type of encapsulating resin used are well-known. Generally, such fillers include granular materials such as alumina, silica, glass, carbon black $CaCO_3$, or other organic or minal materials. Fibrous materials can also be used if desired.

Although thermoplastic resins are not generally used for encapsulation purposes, they can be used if desired. Useful such thermoplastic resins, include, for example, polyvinyl chloride, polyolefins, such as low-density polyethylene, high density polyethylene, polypropylene, and polystyrene.

Generally, the art is well aware of which resins are suitably reactive with the organometallic Z-group on the silane compound. For example, vinyl groups are reactive with polyesters; vinyl carboxy esters, such as methacryloxypropyl, are reactive with both polyesters and phenolics, as well as epoxies; the same is true for amino compounds and glycidyl ethers. Chloralkyl groups are reactive with epoxy resins and nitrile-/phenolic resins.

In carrying out the single-step encapsulating process of this invention, it has been found that the trialkoxy organometalsilane compound forms the desired moisture-resistant film under the usual conditions utilized for the encapsulation, or molding, of the conventional resin materials used for such purpose. Such temperatures are substantially always above that necessary to initiate the activity of the trialkoxy organometalsilane compound to form the desired result.

The encapsulation with resins is usually carried out by way of injection molding operations, the temperatures and pressures to be utilized being well-known to the art. There is no reason to modify these conventional operating procedures when a trialkoxy organometalsilane is added to the resin compound in accordance with the present invention.

For example, thermosetting polyesters resin, filled with granular mineral fillers, and containing a low-shrinkage additive such as polystyrene, are especially useful for encapsulation of delicate electronic and electrical semiconductor devices. The polyester resins are molded preferably at temperatures in the range of from about 125° C. to about 200° C., and preferably at temperatures of about 135° C. to about 150° C. The mold for forming the outer surface of the capsule is preferably formed of an iron material, such as steel, but can also include, e.g., such metals as aluminum, nickel, zinc, chrome and copper.

The examples which follow illustrate preferred examples of the present invention, but are not intended to be exclusive of the full range thereof. The various conventional materials, which are utilized, can be substituted for by their equivalents, including those materials which are presently available, as well as those materials which may become available in the future.

The organometal trialkoxy silane useful as an additive for thermosetting resins can be readily prepared by reacting the corrsponding organo trialkoxy silane, especially one having a replaceable hydrogen, with the desired metal, in the presence of a free radical initiator, such as an organic peroxide compound. Hydrogen gas is evolved during the reaction.

As one example, sodium-vinylbenzene-tri-(methoxy) silane has been readily produced by reacting, in substantially stoichiometric proportions, and at room temperature, vinylbenzene-tri-(methoxy)silane and sodium (metal), in the presence of tert.-butyl perbenzoate (($CH_3)_3COOOCC_6H_5$) catalyst. The reaction, it is believed, can proceed with other catalysts as well. When reacting about 100 grams of the silane, two or three drops of the catalyst is sufficient. The evolved hydrogen gas is carefully ducted away to avoid accidental explosions. The vinylbenzene tri(methoxy)silane is commercially obtainable as a liquid under the trade designation "Z-6032" silane organoreactive silane, from Dow Corning Company. The same procedure can be followed with any trialkoxy silane compound having an active hydrogen atom on the fourth organic group. As a further example n-beta-(aminoethyl)-gamma-aminopropyl trimethoxysilane is available from the Dow Corning Company under the trade designation "Z-6020". The same hydrogen replacement reaction occurs with the other alkali metals or with aluminum, for example.

EXAMPLE 1

A resin composition, 100 grams of a commercialy available resin, formed of a linear unsaturated polyester formed by condensing propylene glycol with maleic anhydride and isophthalic acid, and containing styrene as a crosslinking agent in an amount of about 32% of the total resin mixture, is admixed with 3 grams of carbon black in a mixing vat. The resin composition and pigment combination is then admixed with an additive formulation to form the following composition:

| Ingredients | Weight (grams) |
| --- | --- |
| Resin | 100 |
| Pigment | 3 |
| *Internal Release Agent | 36 |
| Internal Release + Surface Condition | .20 |
| Antifoam | 1 drop |
| Cure Inhibitor | .004 |
| Mineral fillers (Wollastinite) | 245 |
| Curing agent | 1 |
| *Sodium-vinylbenzene-tri(methoxy)silane. | 1 |

The material is admixed in accordance with conventional practice, as follows:

A conventional pigment paste is prepared, by adding pigment to the polyester in a Cowles mixer, operated at 2000 rpm for 5 minutes. The other liquid ingredients are then added while the mixer is operated at 1500 rpm. The mineral fillers are then added, and the mixer speed is reduced to 750 rpm, to avoid excessive temperature rise due to heat from friction. The curing agent is added last, while mixing at 750 rpm is contained for an additional 5 to 10 minutes, until a uniform mixture is obtained.

During mixing, care must be taken, as is well known in the art, to avoid speeds which would increase temperature due to friction, to a point which would result in the loss of a substantial amount of the relatively volatile styrene material, or alternatively, initiate a low level curing reaction.

The above mixture of additives plus the resin is then injection molded to form a capsule, in accordance with the procedure and apparatus set forth, example, in U.S. Pat. No. 3,608,150, a semiconductor diode having been first inserted into the mold as a substrate for the capsule. The ends of the leads of the diode extend out from the mold, so that they are not coated with resin.

The molded article readily separates from the mold walls following completion of curing and cooling and the surface of the molded encapsulated semiconductor diode is smooth in accordance with good molding practice.

A second molded capsule is formed identical to the above except that the silane compound is omitted.

The effect of the presence of the alkoxy silane compound of this invention on the resin capsule for a semiconductor diode is shown by placing two molded capsules formed as above into a breaker of clear, melted paraffin wax, which is maintained at an elevated temperature above the melting point. Bubbles are observed coming from the lead-capsule junction for the second molded capsule, but not from the first molded capsule. The impermeability of the capsule containing the organometalsilane compound is thus illustrated.

In a further comparative test, third and fourth samples of the molded encapsulated diodes are formed; the third sample is identical to the first molded capsule, described above. The fourth molded capsule differs only in using vinylbenzene-tri(methoxysilane in place of the organometal silane of this invention. The capsules are tested for conductivity. The fourth capsule is found to be conductive, whereas the organometal silane has maintained the third capsule substantially nonconductive.

The presence of the organometal silane also increases the structural strength of laminates containing a resin and fiberglass. For example, the addition of the organometal silane to an epoxy-fiberglass laminate almost doubles the flexural strength as measured in accordance with ASTM D-790. The flexural strength of a polyester-fiberglass laminate is improved about 150%, in the same test. Similar effects are noted for tensile strengths and flexural elastic modulus.

The patentable aspect of the present invention, which are claimed, are as follows:

1. An encapsulated electric or electronic device, the device having a surface selected from the group consisting of metals and semi-metals, the capsule being formed from a thermosetting liquid resin composition designed and adapted for use in an injection molding process, the composition comprising an unsaturated thermosettable resin capable of cross-linking to form a thermoset polymer and a cross-linking monomer capable of copolymerizing with the thermosettable liquid to form a cross-linked thermoset polymer, and a trialkoxy organometalsilane compound in an amount sufficient to significantly improve the moisture resistance of the capsule to protect the device, the trialkoxy organometalsilane compound having the empirical formula:

$$(C_xH_{2x+1}O)_3SiZ-M$$

wherein X is an integer from 1 to about 6, Z is an organic group containing up to about 28 carbon atoms and reactive with the encapsulating resin, Z being linked to the silicon atom by a carbon atom, and M is a metal, the capsule being formed in a mold having a metallic surface directly in contact with the molded material.

2. The device of claim 1 wherein M is selected from the group consisting of sodium, potassium, lithium, cesium and aluminum.

3. The device of claim 2 wherein the trialkoxy organometalsilane compound is present in an amount of from about 0.5 to about 5 percent by weight of the thermoset polymer.

4. The device of claim 2 wherein x is not greater than 3.

5. The device of claim 4 wherein Z contains nor more than about 20 carbon atoms.

6. The device of claim 1 wherein Z contains from about 6 to about 18 carbon atoms.

7. The device of claim 3 wherein x is 1, Z contains from about 6 to about 18 carbon atoms and M is an alkali metal selected from the group consisting of sodium, potassium, lithium and cesium.

8. The device of claim 7 wherein the device has a semiconductor surface.

9. The device of claim 8 wherein M is sodium.

10. An encapsulated electric or electronic device, the device having a surface selected from the group consisting of metals and semi-metals, the capsule being formed from a thermosetting liquid resin composition designed and adapted for use in an injection molding process, the composition comprising an unsaturated thermosettable resin capable of cross-linking to form a thermoset polymer and a cross-linking monomer capable of copolymerizing with the thermosettable liquid to form a cross-linked thermoset polymer and a trialkoxy organometalsilane compound in an amount sufficient to significantly improve the moisture resistance of the capsule to protect the device, the trialkoxy organometalsilane compound having the empirical formula:

$$(C_xH_{2x+1}O)_3SiZ\text{---}M$$

wherein X is an integer from 1 to about 6, Z is an organic group containing up to about 28 carbon atoms and reactive with the encapsulating resin, and M is a metal, the capsules being formed in a mold having a metallic surface directly in contact with the molded material.

11. The device of claim 1 or 10 wherein the thermosettable liquid resin comprises a polyester resin.

* * * * *